(12) United States Patent
Backes et al.

(10) Patent No.: US 9,628,044 B2
(45) Date of Patent: Apr. 18, 2017

(54) PARAMETER SCANNED TUNABLE ANTENNA

(71) Applicant: Honeywell International Inc., Morristown, NJ (US)

(72) Inventors: Glen Backes, Maple Grove, MN (US); Lisa Lust, Minneapolis, MN (US); Kelly Muldoon, Minneapolis, MN (US); Doug Carlson, Woodbury, MN (US)

(73) Assignee: Honeywell International Inc., Morris Plains, NJ (US)

( * ) Notice: Subject to any disclaimer, the term of this patent is extended or adjusted under 35 U.S.C. 154(b) by 242 days.

(21) Appl. No.: 14/537,584

(22) Filed: Nov. 10, 2014

(65) Prior Publication Data

US 2016/0134254 A1    May 12, 2016

(51) Int. Cl.
*H04B 5/00* (2006.01)
*H03H 7/40* (2006.01)
*H02J 7/02* (2016.01)

(52) U.S. Cl.
CPC ............. *H03H 7/40* (2013.01); *H02J 7/025* (2013.01)

(58) Field of Classification Search
CPC .......... H03H 7/40; H04B 1/18; H04B 1/0458; H04B 5/0037; H03F 1/32; H01Q 13/18; H01Q 1/50; H03J 7/04; H02J 7/025; H04N 5/08; H04N 5/10; H04N 5/50
See application file for complete search history.

(56) References Cited

U.S. PATENT DOCUMENTS

| | | | |
|---|---|---|---|
| 2007/0147553 A1* | 6/2007 | Bhat | H03F 1/32 375/345 |
| 2014/0266965 A1* | 9/2014 | Herrero | H01Q 1/245 343/861 |
| 2015/0172426 A1* | 6/2015 | Asrani | H04B 1/40 455/77 |

* cited by examiner

*Primary Examiner* — Thanh Le
(74) *Attorney, Agent, or Firm* — Schwegman Lundberg & Woessner, P.A.

(57) ABSTRACT

Generally discussed herein are techniques, software, apparatuses, and systems configured for tuning an antenna. In one or more embodiments, a method can include sending, by processing circuitry, one or more signals to an antenna tuner to sweep the tuner through a plurality of tuner states, determining a plurality of power values, each power value corresponding to a signal received from an antenna and each power value corresponding to the tuner being in a state of the plurality of tuner states, and sending one or more signals to the tuner to set the tuner to a tuner state of the plurality of tuner states, the tuner state determined using the determined powers.

18 Claims, 5 Drawing Sheets

PARAMETER SCANNED TUNABLE ANTENNA

GOVERNMENT RIGHTS

This invention was made with United States Government support under Contract Number 14-G-3019-0001. The United States Government has certain rights in this invention.

BACKGROUND

An antenna can couple an electrical connection to an electromagnetic field. Antennas are typically used to transmit signals between devices. Antennas can include conductors or other materials that interact with an electric field. An antenna can be multi-directional (e.g., omnidirectional) or unidirectional (often referred to a directional). Antenna performance is generally an important component in establishing a successful communication link.

SUMMARY

In one or more embodiments, an apparatus can include an antenna, a processor electrically coupled to the antenna, a detector electrically coupled to the processor, and an antenna tuner electrically coupled between the antenna and the processor. The processor can be programmed to send one or more signals to the tuner to sweep the tuner through a plurality of tuner states, wherein the detector is coupled to determine a power of a signal received from the antenna in each respective tuner state, and wherein the processor is further programmed to send one or more signals to the tuner to set the tuner to a tuner state of the plurality of states using the determined powers. A directional coupler can be electrically coupled between the antenna and the detector. The power of the signal received can be a scaled portion of a signal reflected from the antenna. The reflected signal can be received at the detector through the directional coupler.

In one or more embodiments, a method can include sending, by processing circuitry, one or more signals to an antenna tuner to sweep the tuner through a plurality of tuner states, determining a plurality of power values, each power value corresponding to a signal received from an antenna and each power value corresponding to the tuner being in a state of the plurality of tuner states, and sending one or more signals to the tuner to set the tuner to a tuner state of the plurality of tuner states, the tuner state determined using the determined powers.

In one or more embodiments, a non-transitory computer readable medium can include instructions stored thereon that, when executed by a machine, configure the machine to send one or more signals to an antenna tuner to sweep the tuner through a plurality of tuner states, determine a plurality of power values, each power value corresponding to a signal received from an antenna and each power value corresponding to the tuner being in a state of the plurality of tuner states, and send one or more signals to the tuner to set the tuner to a tuner state of the plurality of tuner states, the tuner state determined using the determined powers.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
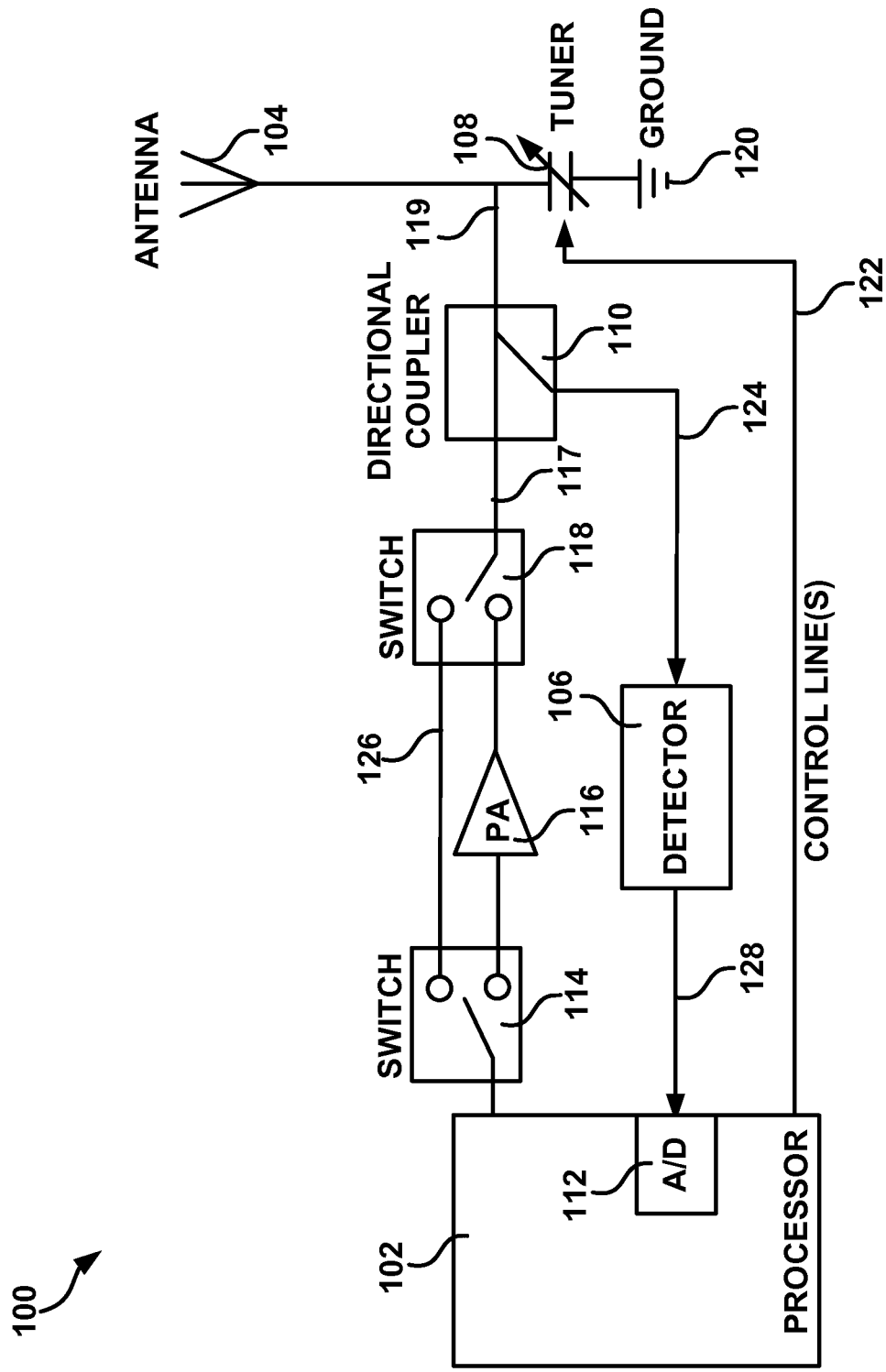
FIG. 1 illustrates a block diagram of an example of a tunable antenna system, in accord with one or more embodiments.

While embodiments of this disclosure can take many different forms, specific embodiments thereof are shown in the figures and will be described herein in detail with the understanding that the present disclosure is to be considered as embodiments of the principles of the disclosure, as well as the best mode of practicing the same, and is not intended to limit the disclosure to the specific embodiments illustrated.

An antenna can be sensitive to an electric field near (e.g., in the near-field of) the antenna. This electric field can be changed by objects in the vicinity of the antenna. For example, an electric field in the vicinity of an antenna can be affected by a hand, head, a surface, moisture, or other object or material in the vicinity of the antenna. This change in the electric field can cause an impedance mismatch between the antenna and the surrounding environment. The impedance mismatch can cause a portion of a signal to be transmitted by the antenna to be reflected, thus reducing the power of the transmitted signal. One or more embodiments discussed herein can help reduce the impedance mismatch and, as a result, can help increase an amplitude (e.g., power) of a transmitted signal.

Most RF devices are susceptible to antenna performance degradation, such as can be due to the proximity of a hand, head, or other object that can be close to the antenna. The degradation can be caused by an impedance mismatch that can be caused by a change in the environment around the antenna. This antenna degradation can reduce the effective range of communication, and in the case of devices with level control (e.g., automatic level control), can limit battery life due to excessive power consumption of a power amplifier (PA).

This degradation or detuning effect can be more pronounced on electrically small, high quality factor (high Q) antennas that can have a narrow bandwidth. The amount of detuning can be relatively arbitrary or random. Also, it can be difficult to pre-tune an antenna in a development or production process due to the wide range of detuning variance and the impedance variation of the surrounding environment. Another challenge associated with the detuning of the antenna can include a damaging voltage level incident on a transmit PA output being produced as a result of a reflected wave from a de-tuned antenna.

One or more embodiments discussed herein can help improve the ability of the antenna to resist detuning. By monitoring (e.g., automatically) a transmitted or reflected signal amplitude of an antenna, a correction signal can be provided to a tunable element that can help counteract the effects of inadvertent loading. The correction signal can alter an impedance of the tunable element, such as to help match an impedance of antenna to an impedance of the surrounding environment.

One or more embodiments discussed herein can determine a signal amplitude or power of a signal reflected from an antenna. Such an embodiment can use the reflected antenna signal amplitude as a variable to determine an impedance value (state) of one or more tunable electronic element(s) (e.g., a variable capacitor, variable inductor, variable resistor or a combination thereof) that provides the least reflected antenna signal amplitude or power. The least reflected amplitude or power can be an indication of maximized power delivery through the antenna, which can help in maximizing a radiated output power, given the circuit elements of the device.

In one or more embodiments, an RF transmitter can deliver power to an antenna through a low-loss path of a directional coupler. For a given condition of a perfectly tuned antenna (i.e. a perfect impedance match with the surrounding environment), there will be no reflected signal. Upon antenna loading (i.e. an impedance mismatch), such as can be caused by a hand, head or other object in the near field of an antenna, the resonant frequency of the antenna can change (e.g., the impedance of the antenna can change), causing a reflection at the original intended transmit frequency. This signal can reflect from the antenna back through the coupled port of the directional coupler. This reflected signal is electrically isolated from the "forward path" signal (the output from the PA), thus the reflected signal is representative of the signal as reflected from the antenna. The reflected signal can be detected with a circuit such as a diode detector and/or filter which can convert the RF signal to a proportional direct current (DC) voltage. This DC voltage can be sampled with an A/D converter for processing in a microcontroller or microprocessor.

The tunable element(s) (e.g., a digitally tunable capacitor or varactor) can be swept in value (i.e. through a variety of states where each state can correspond to a different impedance value), and with each sweep point an A/D sample can be taken from a signal reflected by the antenna. The A/D samples can be compared to determine a state of the tunable element(s) that corresponds to the smallest reflected signal. The tunable element can be set to this state, such as during the RF transmission.

In one or more embodiments, a signal transmitted by the antenna (as opposed to a signal reflected by the antenna) can be used to determine a state for the tunable element(s). Such embodiments can be used in, for example, a device with wireless recharge circuitry or a second antenna. A device can use a second antenna (e.g., a recharging antenna) as a sort of near-field sensor, such as to sense a portion of the radiated RF signal from a transmit antenna. This signal can be detected using a detector and sampled with an A/D converter as in embodiment(s) previously discussed. Since samples are taken of the radiated power (as opposed to sampling reflected power as described previously) a processor can tune the tunable element(s) to a value that corresponds to a highest sampled value, such as to increase a radiated output power.

Reference will now be made to the FIGS. to further describe details of embodiments of the disclosure.

FIG. 1 shows an example of a tunable antenna system 100, in accord with one or more embodiments. The system 100 can be a part of a radio transmitter, receiver, or transceiver. The system 100 can be a part of a phone (e.g., a smartphone, cellular phone, or other phone), tablet, desktop computer, thermostat, or other device that includes a radio receiver, transmitter, or transceiver. The system 100 can include a processor 102, an antenna 104, a detector 106, and a tuner 108.

The processor 102 can be electrically coupled to the detector 106, the tuner 108, or a switch 114, such as in parallel. The detector 106 can be electrically coupled to the processor 102 through a connection 128. The detector 106 can be electrically coupled to a directional coupler 110 through a connection 128. The switch 114 can be electrically coupled, such as on alternative paths, to a power amplifier (PA) 116 and another switch 118. The switch 114 can be electrically coupled to the switch 118 through a bypass connection 126. The switch 118 can be electrically coupled to a low loss path of the directional coupler 110 through the electrical connection 117. The directional coupler 110 can be electrically coupled to the antenna 104 and the tuner 108, such as through the directional controller output connection 119. The processor 102 can be electrically coupled to the tuner 108, such as through one or more control lines 122.

The processor 102 can include one or more microprocessors or processing circuitry (e.g., combinational or state logic gates, or electrical components, such as resistors, transistors, capacitors, inductors, wires, diodes, or other electrical components) arranged (e.g., programmed) to perform operations as discussed herein. The operations of the processor 102 can be implemented in one or more modules. The processor 102 can be electrically coupled to one or more switches 114 or 118. The switch 114 or 118 can include a single pull double throw (SPDT) type of switch or other switch. A multiplexer, transistor, or other switching type device can be used in place of the switch 114 or 118. The processor 102 can send a signal to the antenna 104, such as can be transmitted by the antenna 104. The signal can pass through the switch 114 to the radio frequency (RF) power amplifier (PA) 116. The PA 116 can boost the power of a signal, so as to help increase a range of a signal transmitted by the antenna 104.

The PA 116 can be electrically coupled between the switches 114 and 118, such as shown in FIG. 1. The output of the PA 116 can be input to a directional coupler 110. The directional coupler 110 can provide a low loss path for the amplified signal to be transmitted to the antenna 104. The antenna 104 can transmit the signal from the coupler 110.

If an impedance of the antenna 104 does not match an impedance of the environment the antenna 104 is transmitting in, a portion of the signal from the antenna 104 can be reflected back towards the directional coupler 110. The tuner 108 can be a variable impedance device that can be adjusted to change the impedance of the antenna 104. The tuner 108 can be electrically coupled between the antenna 104 and a reference voltage, such as ground 120 as shown in FIG. 1. The tuner 108 can be adjusted by transmitting a digital word on the control line(s) 128 or transmitting a voltage on the control line(s). Different digital words or voltages can correspond to different impedance values of the tuner 108.

At least a portion of the signal reflected from the antenna 104 towards the directional coupler 110 can travel through a reflected signal connection 124 towards the detector 106. The detector 106 can determine an amplitude of a received signal (or a power if the received signal is passed through an impedance). The determined amplitude can be an analog signal that is sent through the connection 128 to an analog to digital (A/D) converter 112. The A/D converter 112 can process the analog signal so as to convert the analog signal to a digital word representative of the amplitude or power of the received signal. While FIG. 1 shows the A/D converter 112 as part of the processor 102, the A/D converter 112 can include a standalone chip or can be a part of the detector 106.

The antenna 104 can receive a signal, such as can be transmitted from a different antenna. The received signal can be directed to the directional coupler 110. The majority of the signal received at the directional coupler 110 can be transmitted to the switch 118 and through the bypass connection 126 and the switch 114 to the processor 102. The processor 102 can then interpret the signal from the bypass connection 126, such as to determine contents of a message being transmitted by the different antenna.

To help reduce the impedance mismatch between the antenna 104 and the environment external to and/or near the antenna 104, the processor 102 can transmit a signal to the tuner 108, such as through one or more control line(s) 122, such as to set the tuner 108 to a tuner state. Each tuner state of the tuner 108 can correspond to a different impedance. For example, the tuner 108 can include a first impedance when the tuner is set to a first tuner state and a second, different impedance when the tuner is set to a second tuner state. By having a variable impedance, the tuner 108 can help in matching an impedance of the antenna 104 to an impedance of the surrounding environment.

The processor 102 can sweep the tuner 108 through a plurality of tuner states and (e.g., concurrently) send one or more signals to the antenna 104 for each tuner state. Thus, the tuner 108 can be set to a first state by the processor 102, a signal can be transmitted through the antenna 104, and a reflected signal from the antenna 104 can be received at the detector 106. This process can be repeated for one or more states of the tuner 108, such as to sweep the tuner 108 through multiple tuner states. The amplitude(s) of the reflected signal(s), as determined by the detector 106, can be compared (e.g., by the processor 102), such as to determine a minimum, maximum, or a specified amplitude or power of a reflected signal. The processor 102 can then set the tuner 108 to the tuner state that corresponds to the minimum, maximum, or other specified amplitude or power. In the case of a reflected signal, in one or more embodiments, the processor 102 can determine the amplitude that is the smallest of all the reflected signals and set the tuner 108 to the value that corresponds to the smallest amplitude. This value of the tuner 108 can cause a power of the transmitted signal to be maximized in accord with the current circuit and operating conditions (e.g., environment external to the antenna 104 or the circuitry of the system 100).

Since the environment external to the antenna 104 can change, the maximum transmission power of the antenna 104 can change. Similarly the state of the tuner 108 that corresponds to the maximum output power of the antenna 104 can change with the external environment as well. To help alleviate the effects of the changing environment, the operations for sweeping and selecting the value for the tuner 108 can be done multiple times, which can be predetermined or dynamic. For example, if the reflected data over a period of time indicates that the antenna is in a static condition, such as a condition of the device sitting on a table or being mounted on a wall, then it can be unnecessary to perform the tuning operation(s) frequently. In one or more embodiments, the processor 102 can dynamically adapt and learn how often to perform the tuning operation(s), such as to find a new state of antenna adjustment. Such an embodiment can have the added benefit of reducing DC power consumption by limiting the number of A/D conversions that occur, while still increasing the power output of the antenna 104.

In one or more embodiments, the operations of sweeping the tunable element(s) through the state(s) and setting the tunable element(s) to a value can be done periodically with relatively little time (e.g., fractions of a second to minutes) between sweeps. Such embodiments can be helpful for devices that are subject to external environments that change relatively often (e.g., phones, tablets, laptops, smart wearable devices, such as glasses or watches, or other devices).

In one or more embodiments, the operations of sweeping the tunable element(s) through the state(s) and setting the tunable element(s) to a value can be done periodically with a relatively large amount of time (e.g., hours, days, weeks, months, or years) between sweeps. Such embodiments can be helpful for devices that are subject to relatively static external environments (e.g., thermostats, desktop computers, smart monitors, smart televisions or video players, video game consoles, or other devices).

Note that other sweeping timeframes can be used, such as random time frames between sweeping, such as a user-initiated sweep or other. In one or more embodiments, an amplitude of a reflected or transmitted signal can be monitored and the tunable element(s) can be swept in response to determining the reflected or transmitted signal is greater than, less than, or equal to a predetermined threshold.

Figure 2:
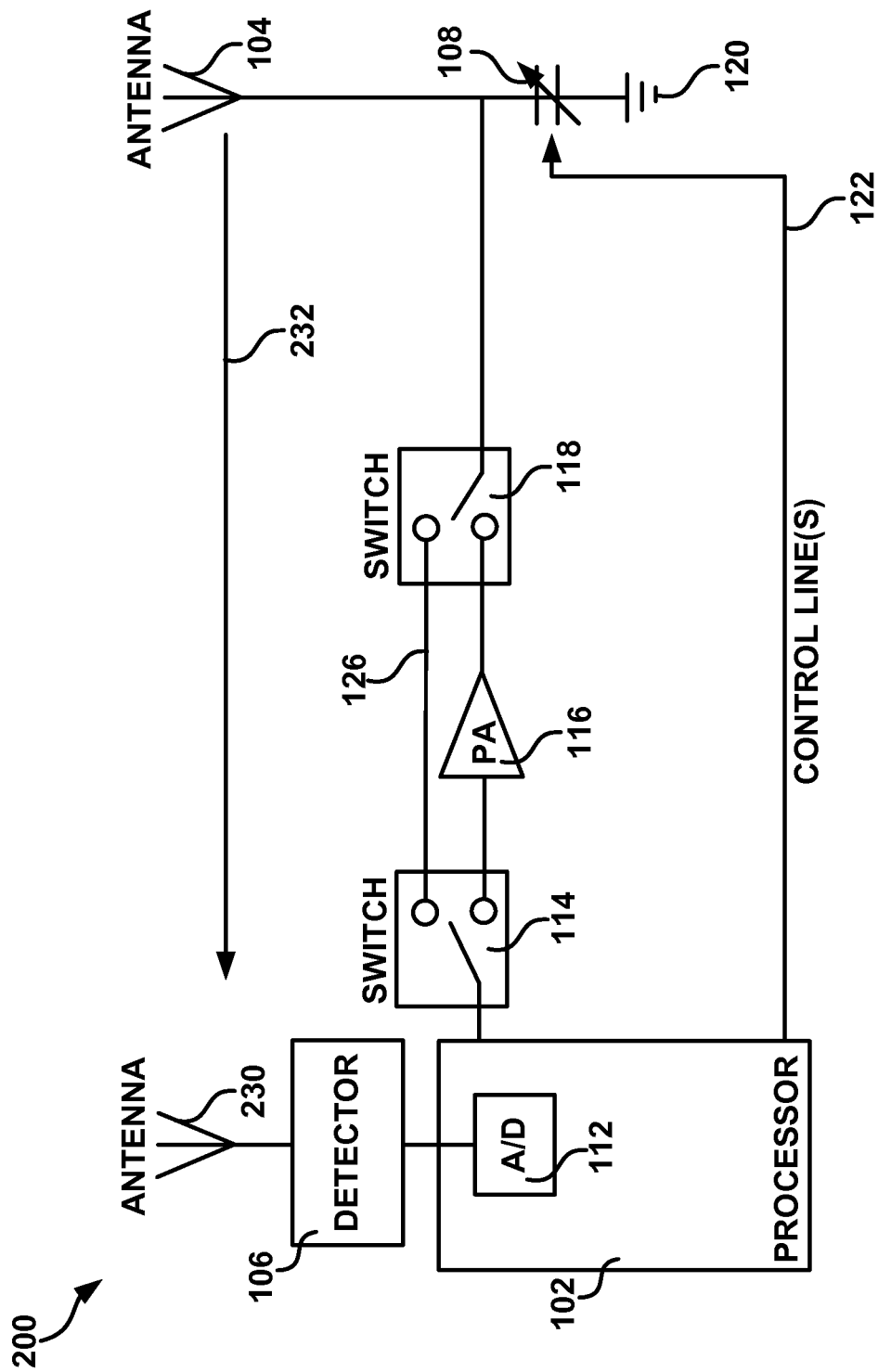
FIG. 2 illustrates a block diagram of an example of another tunable antenna system, in accord with one or more embodiments.

FIG. 2 shows an example of another tunable antenna system 200, in accord with one or more embodiments. The system 200 can be similar to the system 100, with the system 200 configured to tune the antenna 104 based on a transmitted signal instead of a reflected signal, as discussed with regard to FIG. 1. The system 100 can be a part of a radio transmitter, receiver, or transceiver. The system 200 can be a part of a phone (e.g., a smartphone, cellular phone, or other phone), tablet, desktop computer, thermostat, or other device that includes a radio. The system 200 can include the processor 102, the antenna 104, the detector 106, and the tuner 108. The system 200 can include an additional antenna 230 to receive a signal transmitted from the antenna 104, such as is indicated by the arrow 232.

Similar to the system 100 of FIG. 1, the processor 102 can be electrically coupled to the one or more switches 114 or 118. The processor 102 can send a signal to the antenna 104, such as can be transmitted by the antenna 104. The signal can pass through the switch 114 to the radio frequency (RF) power amplifier (PA) 116.

The antenna 104 can receive a signal, such as can be transmitted from a different antenna. The received signal can be directed to the switch 118 and through the bypass connection 126, the switch 114, and to the processor 102. The processor 102 can then interpret the signal.

If an impedance of the antenna 104 does not match an impedance of the environment the antenna 104 is transmitting in, the amplitude or power of a signal received at the antenna 230 can be reduced.

The tuner 108 can be a variable impedance device that can be adjusted to change the impedance of the tuner 108 and can help match the impedance of the antenna 104 to the impedance of the external environment. The detector 106 can determine an amplitude of a signal received at the antenna 230 (or a power if the received signal is passed through an impedance).

To help reduce the impedance mismatch between the antenna 104 and the environment external to and/or near the antenna 104, the processor 102 can transmit a signal to the tuner 108, such as through the one or more control line(s) 122, such as to set the tuner 108 to a tuner state. Each tuner state of the tuner 108 can correspond to a different impedance.

The processor 102 can sweep the tuner 108 through a plurality of tuner states and (e.g., concurrently) send one or more signals to the antenna 104 for each tuner state. Thus, the tuner 108 can be set to a first state by the processor 102, a signal can be transmitted through the antenna 104, and a transmitted signal from the antenna 104 can be received at the antenna 230. This process can be repeated for one or more states of the tuner 108, such as to sweep the tuner 108 through tuner states. The amplitudes of the transmitted signal(s), as determined by the detector 106, can be compared (e.g., by the processor 102), such as to determine a minimum, maximum, or a specified amplitude of a reflected signal. The processor 102 can then set the tuner 108 to the tuner state that corresponds to the minimum, maximum, or other specified amplitude. In the case of a transmitted signal, in one or more embodiments, the processor 102 can determine the amplitude that is the largest of all the transmitted signals and set the tuner 108 to the tuner state that corresponds to the largest amplitude. This value of the tuner 108 can cause a power of the transmitted signal to be maximized in accord with the current circuit and operating conditions (e.g., environment external to the antenna 104).

Since the environment external to the antenna 104 can change, the maximum transmission power of the antenna 104 can change. Similarly the state of the tuner 108 that corresponds to the maximum output power of the antenna 104 can change with the external environment as well. Thus, the tuner 108 can be swept periodically or randomly through multiple tuner states and adjusted according to a reflected or transmitted value.

Figure 3:
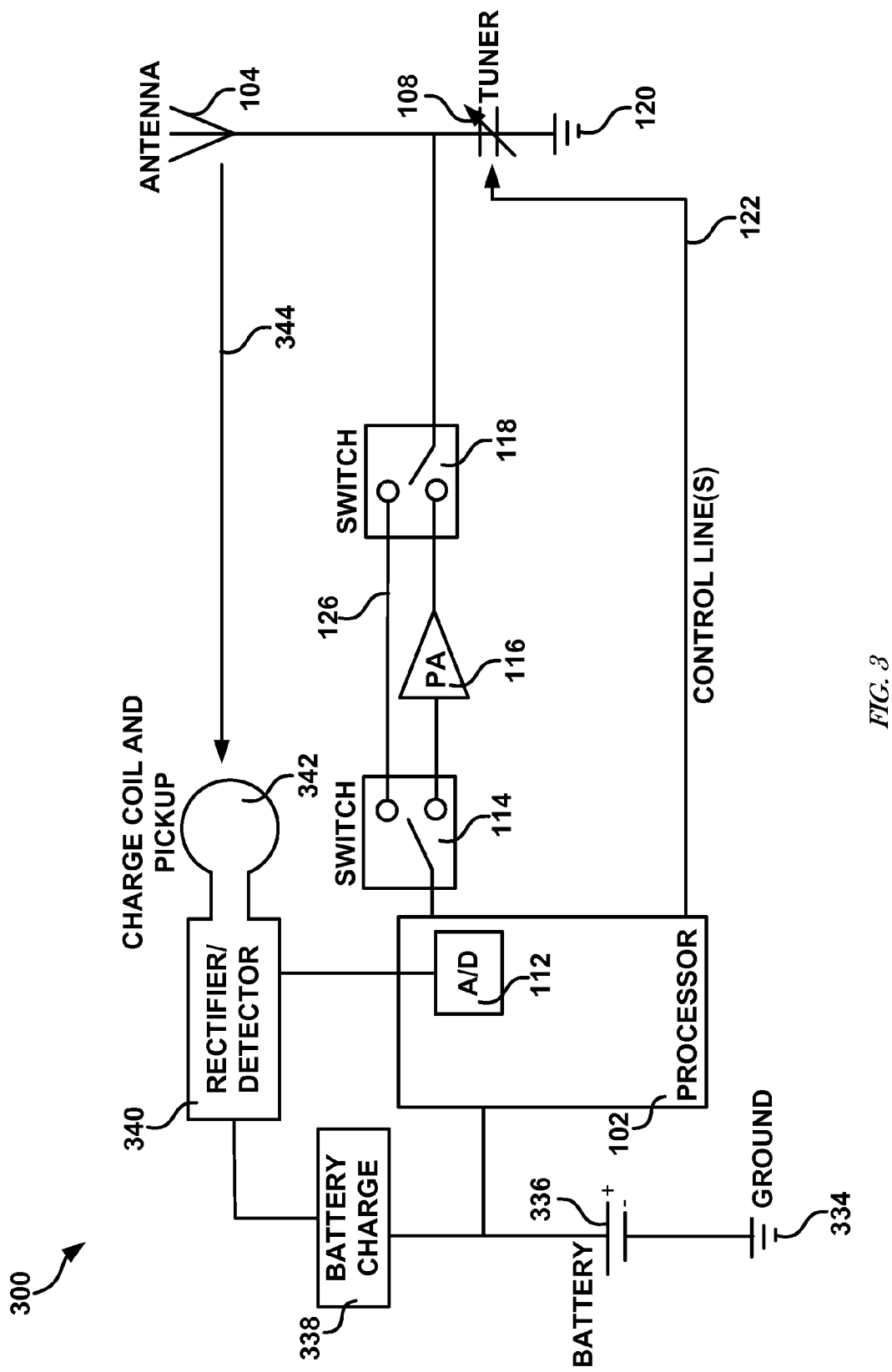
FIG. 3 illustrates a block diagram of an example of yet another tunable antenna system, in accord with one or more embodiments.

FIG. 3 shows an example of another tunable antenna system 300, in accord with one or more embodiments. The system 300 can be similar to the system 200 with the system 300 including a wireless charging system that can include a charge coil and pickup 342, a rectifier/detector 340, a battery charge circuit 338, and a battery 336. The charge coil and pickup 342 can include an antenna (i.e. pickup), such as can be similar to the antenna 104 or 230. The charge coil and pickup 342 can receive a signal transmitted by the antenna 104. The charge coil and pickup 342 can provide the received signal to the rectifier/detector 340. The rectifier/detector 340 can convert a received alternating current (AC) signal and convert it to a direct current (DC) signal. The rectifier/detector 340 can include functionality as described with regard to the detector 106. The signal from the rectifier/detector 340 can be provided to battery charge circuitry 338 that can convert a signal received to a charging current that charges the battery 336. The battery 336 can provide electrical energy that powers a device. The battery 336 can be electrically coupled to the processor 102, battery charge circuitry 338, or a reference voltage (e.g., ground 334). The ground 334 can include the same electro-potential as the ground 120. Using circuitry, such as the charging circuitry shown in FIG. 3, the signal transmitted from the antenna can be used to charge the battery 336 and can also be used to help increase the transmit power of the antenna 104.

Similar to the system 100 or 200, the processor 102 can sweep the tuner 108 through a plurality of tuner states and (e.g., concurrently) send one or more signals to the antenna 104 for each tuner state. Thus, the tuner 108 can be set to a first state by the processor 102, a signal can be transmitted through the antenna 104, and a transmitted signal from the antenna 104 can be received at the antenna charge coil and pickup 342. This process can be repeated for one or more states of the tuner 108, such as to sweep the tuner 108 through tuner states. The amplitudes of the transmitted signal(s), as determined by the rectifier/detector 340, can be compared (e.g., by the processor 102), such as to determine a minimum, maximum, or a specified amplitude of a transmitted signal. The processor 102 can then set the tuner 108 to the tuner state that corresponds to the minimum, maximum, or other specified amplitude. In the case of a transmitted signal, in one or more embodiments, the processor 102 can determine the amplitude that is the largest of all the transmitted signals and set the tuner 108 to the tuner state that corresponds to the largest amplitude. This value of the tuner 108 can cause a power of the transmitted signal to be maximized in accord with the current circuit and operating conditions (e.g., environment external to the antenna 104).

The operations of the processor 102, detector 106, A/D converter 112 tuner 108, antenna 104, or other elements of the systems 100, 200, or 300 can be performed automatically. As used herein, "automatically" means without human input or interference after deployment. That is, the changing of the tuner states, determination of an amplitude or power of a reflected or transmitted signal, comparison of the determined amplitudes, setting of the tuner state, and/or resultant tuning of the antenna 104 can occur without any human input or interference.

Figure 4:
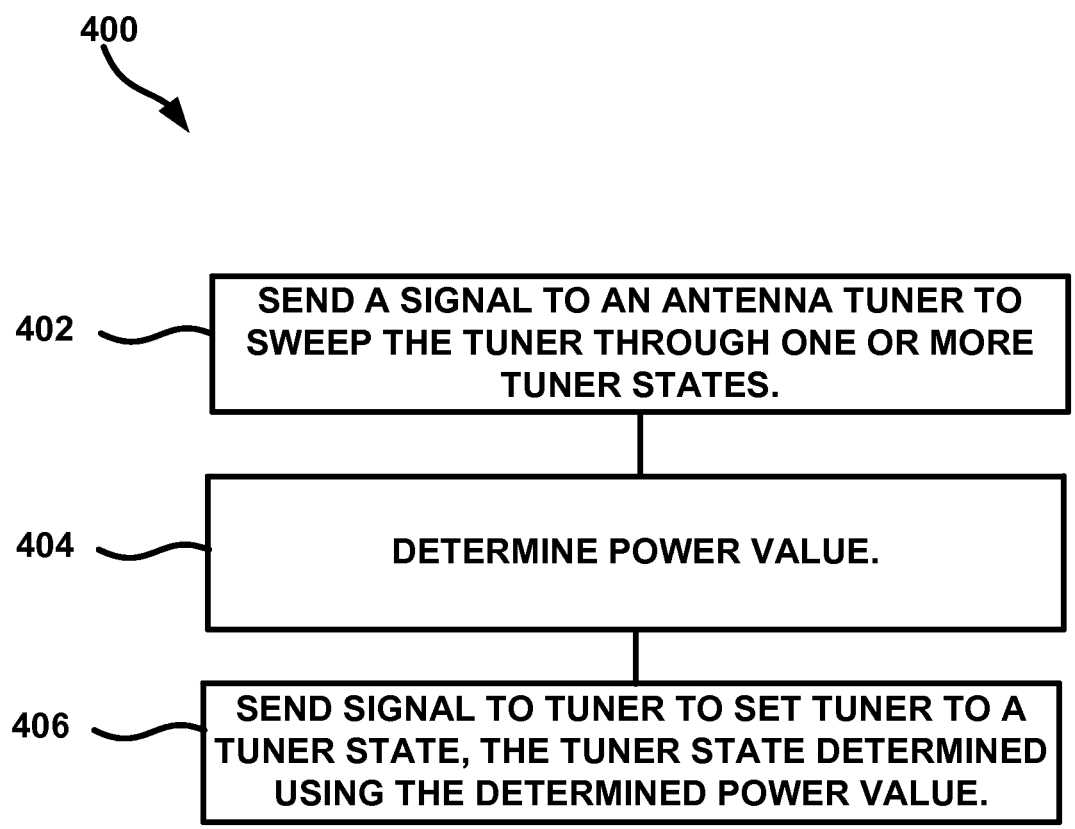
FIG. 4 illustrates a flow diagram of an example of a method, in accord with one or more embodiments.

FIG. 4 shows a flow diagram of an example of a method 400, in accord with one or more embodiments. The method 400 as illustrated includes: sending one or more signals to an antenna tuner to sweep the tuner through a plurality of tuner states, at operation 402; determining one or more power values, at operation 404; sending one or more signals to the tuner to set the tuner to a tuner state of the plurality of tuner states, the tuner state determined using the determined powers, at operation 406. The one or more signal sent to the antenna tuner at operation 402 can be sent by processing circuitry. The power value at operation 404 can include a power value of a plurality of power values. Each power value can correspond to a signal received from an antenna and each power value can correspond to the tuner being in a state of the plurality of tuner states.

The signal from the antenna can be a signal reflected from the antenna. The tuner state the tuner can be set to correspond to a state of the tuner that corresponds to a minimum power of the determined powers.

The antenna can be a first antenna, and the signal is a transmitted signal from the first antenna received at the second antenna. The method 400 can include charging a battery using energy of a signal received at the second antenna. The operation at 402 can include sending the one or more signals periodically.

Figure 5:
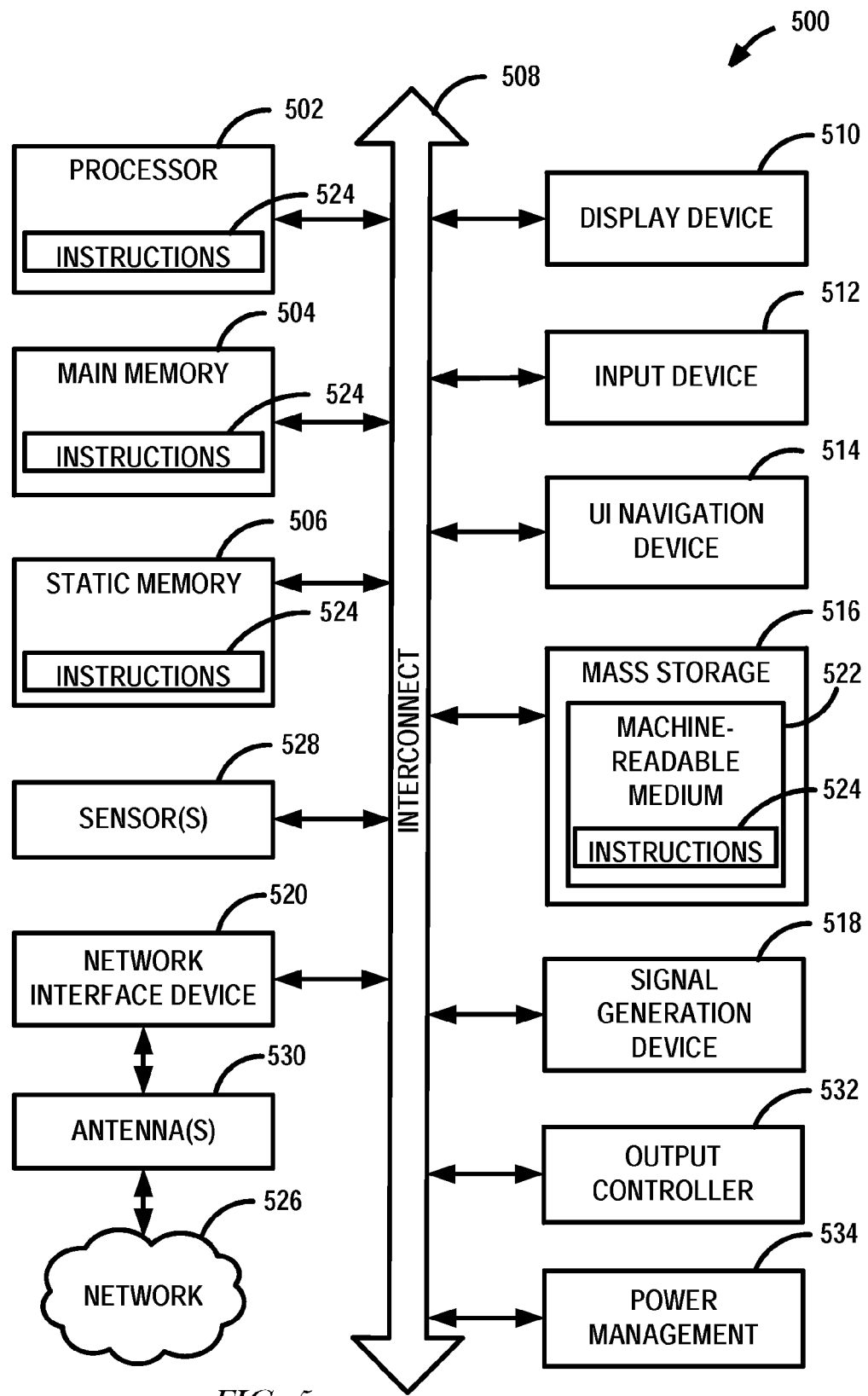
FIG. 5 illustrates a block diagram of an example of a computing device system, in accord with one or more embodiments.

FIG. 5 is a block diagram illustrating an example computer system machine upon which any one or more of the techniques herein discussed can be run. In one or more embodiments, the processor 102, detector 106, or the system 100, 200, or 300 can include one or more items of computer system 500. Computer system 500 can be embodied as a computing device, providing operations of the processor 102 or any other processing or computing platform or component described or referred to herein. In alternative embodiments, the machine operates as a standalone device or can be connected (e.g., networked) to other machines. In a networked deployment, the machine can operate in the capacity of either a server or a client machine in server-client network environments, or it can act as a peer machine in peer-to-peer (or distributed) network environments. The computer system machine can be a personal computer (PC), such as a PC that can be portable (e.g., a notebook or a netbook) or a PC that is not conveniently portable (e.g., a desktop PC), a tablet, a set-top box (STB), a gaming console, a Personal Digital Assistant (PDA), a mobile telephone or Smartphone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Implementing techniques using computer processors and other logic can lead to automated camera condition change detection (e.g., that does not include human interference).

Example computer system 500 can include a processor 502 (e.g., a central processing unit (CPU), a graphics processing unit (GPU) or both), a main memory 504 and a static memory 506, which communicate with each other via an interconnect 508 (e.g., a link, a bus, etc.). The computer system 500 can further include a video display unit 510, an alphanumeric input device 512 (e.g., a keyboard), and a user interface (UI) navigation device 514 (e.g., a mouse). In one embodiment, the video display unit 510, input device 512 and UI navigation device 514 are a touch screen display. The computer system 500 can additionally include a storage device 516 (e.g., a drive unit), a signal generation device 518 (e.g., a speaker), an output controller 532, a power management controller 534, or a network interface device 520 (which can include or operably communicate with one or more antennas 530, transceivers, or other wireless communications hardware), or one or more sensors 528, such as a GPS sensor, compass, location sensor, accelerometer, or other sensor.

The storage device 516 includes a machine-readable medium 522 on which is stored one or more sets of data structures and instructions 524 (e.g., software) embodying or utilized by any one or more of the methodologies or functions described herein. The instructions 524 can also reside, completely or at least partially, within the main memory 504, static memory 506, and/or within the processor 502 during execution thereof by the computer system 500, with the main memory 504, static memory 506, or the processor 502 also constituting machine-readable media. The processor 502 configured to perform an operation can include configuring instructions of a memory or other machine-readable media coupled to the processor, which when executed by the processor, cause the processor 502 to perform the operation.

While the machine-readable medium 522 is illustrated in an example embodiment to be a single medium, the term "machine-readable medium" can include a single medium or multiple media (e.g., a centralized or distributed database, and/or associated caches and servers) that store the one or more instructions 524. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, optical media, and magnetic media. Specific examples of machine-readable media include non-volatile memory, including, by way of example, semiconductor memory devices (e.g., Electrically Programmable Read-Only Memory (EPROM), Electrically Erasable Programmable Read-Only Memory (EEPROM)) and flash memory devices; magnetic disks such as internal hard disks and removable disks; magneto-optical disks; and CD-ROM and DVD-ROM disks.

The instructions 524 can further be transmitted or received over a communications network 526 using a transmission medium via the network interface device 520 utilizing any one of a number of well-known transfer protocols (e.g., HTTP). Examples of communication networks include a local area network (LAN), wide area network (WAN), the Internet, mobile telephone networks, Plain Old Telephone (POTS) networks, and wireless data networks (e.g., Wi-Fi, 3G, and 4G LTE/LTE-A or WiMAX networks). The term "transmission medium" shall be taken to include any intangible medium that is capable of storing, encoding, or carrying instructions for execution by the machine, and includes digital or analog communications signals or other intangible medium to facilitate communication of such software.

Additional Notes and Examples

The present subject matter can be described by way of several examples.

Example 1 can include or use subject matter (such as an apparatus, a method, a means for performing acts, or a device readable memory including instructions that, when performed by the device, can cause the device to perform acts), such as can include or use an antenna, a processor electrically coupled to the antenna, a detector electrically coupled to the processor, and an antenna tuner electrically coupled between the antenna and the processor, wherein the processor is programmed to send one or more signals to the tuner to sweep the tuner through a plurality of tuner states, wherein the detector is coupled to determine a power of a signal received from the antenna in each respective tuner state, and wherein the processor is further programmed to send one or more signals to the tuner to set the tuner to a tuner state of the plurality of states using the determined powers.

Example 2 can include or use, or can optionally be combined with the subject matter of Example 1, to include or use, wherein the signal from the antenna is a reflected signal from the antenna and wherein the detector is electrically coupled between the first antenna and the processor.

Example 3 can include or use, or can optionally be combined with the subject matter of at least one of Examples 1-2, to include or use, a directional coupler electrically coupled between the antenna and the detector, wherein the directional coupler includes a plurality of paths including a first path that provides a path for a majority of the reflected signal and a second path that provides a path for the remainder of the signal, wherein the detector is electrically coupled to the second path of the directional coupler.

Example 4 can include or use, or can optionally be combined with the subject matter of at least one of Examples 1-2, to include or use, wherein the tuner state corresponds to a state of the tuner that corresponds to a minimum power of the determined powers.

Example 5 can include or use, or can optionally be combined with the subject matter of Example 1, to include or use, wherein the antenna is a first antenna, wherein the system further comprises a second antenna, and wherein the signal from the first antenna is a transmitted signal from the first antenna received at the second antenna and wherein the detector is electrically coupled between the second antenna and the processor.

Example 6 can include or use, or can optionally be combined with the subject matter of at least one of Examples 1 and 5, to include or use wireless recharge circuitry including a rectifier electrically coupled between the second antenna and the processor, battery charge circuitry electrically coupled between the second antenna and the processor, and a battery electrically coupled to the battery charge circuitry, wherein the battery charge circuitry is to charge the battery using energy of a signal received at the second antenna.

Example 7 can include or use, or can optionally be combined with the subject matter of at least one of Examples 1, 5, and 6, to include or use, wherein the tuner state the tuner is set to corresponds to a state of the tuner that corresponds to a maximum power of the determined powers.

Example 8 can include or use, or can optionally be combined with the subject matter of at least one of Examples 1-7, to include or use, wherein the processor is programmed to send the one or more signals to the tuner to sweep the tuner through the plurality of tuner states periodically.

Example 9 can include or use, or can optionally be combined with the subject matter of at least one of Examples 1-8, to include or use an analog to digital converter to receive the determined powers and convert each of the determined powers to a digital word.

Example 10 can include or use, or can optionally be combined with the subject matter of at least one of Examples 1-9, to include or use a switch electrically coupled to the processor, the switch including a plurality of electrical paths therethrough including a first electrical path for a signal to be transmitted by the antenna and a second path for a signal received by the antenna.

Example 11 can include or use subject matter (such as an apparatus, a method, a means for performing acts, or a device readable memory including instructions that, when performed by the device, can cause the device to perform acts), such as can include or use sending, by processing circuitry, one or more signals to an antenna tuner to sweep the tuner through a plurality of tuner states, determining a plurality of power values, each power value corresponding to a signal received from an antenna and each power value corresponding to the tuner being in a state of the plurality of tuner states, and sending one or more signals to the tuner to set the tuner to a tuner state of the plurality of tuner states, the tuner state determined using the determined powers.

Example 12 can include or use, or can optionally be combined with the subject matter of Example 11, to include or use, wherein the signal from the antenna is a signal reflected from the antenna and wherein tuner state the tuner is set to corresponds to a state of the tuner that corresponds to a minimum power of the determined powers.

Example 13 can include or use, or can optionally be combined with the subject matter of Example 11, to include or use, wherein the antenna is a first antenna, and wherein the signal is a transmitted signal from the first antenna received at a second antenna.

Example 14 can include or use, or can optionally be combined with the subject matter of Example 13, to include or use charging a battery using energy of a signal received at the second antenna.

Example 15 can include or use, or can optionally be combined with the subject matter of at least one of Examples 11-14, to include or use, wherein sending, by processing circuitry, one or more signals to an antenna tuner to sweep the tuner through a plurality of tuner states includes sending the one or more signals periodically.

Example 16 can include or use subject matter (such as an apparatus, a method, a means for performing acts, or a computer readable including instructions that, when performed by a machine, can configure the machine to perform acts), such as can include or use sending one or more signals to an antenna tuner to sweep the tuner through a plurality of tuner states, determining a plurality of power values, each power value corresponding to a signal received from an antenna and each power value corresponding to the tuner being in a state of the plurality of tuner states, and sending one or more signals to the tuner to set the tuner to a tuner state of the plurality of tuner states, the tuner state determined using the determined powers.

Example 17 can include or use, or can optionally be combined with the subject matter of Example 16 to include or use, wherein the signal from the antenna is a signal reflected from the antenna and wherein tuner state the tuner is set to corresponds to a state of the tuner that corresponds to a minimum power of the determined powers.

Example 18 can include or use, or can optionally be combined with the subject matter of Example 16 to include or use, wherein the antenna is a first antenna, and wherein the signal is a transmitted signal from the first antenna received at a second antenna.

Example 19 can include or use, or can optionally be combined with the subject matter of Example 18 to include or use charging a battery using energy of a signal received at the second antenna.

Example 20 can include or use, or can optionally be combined with the subject matter of at least one of Examples 16-19 to include or use, wherein the instructions for sending one or more signals to an antenna tuner to sweep the tuner through a plurality of tuner states include instructions, which when executed by the machine, configure the machine to, send the one or more signals periodically.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in this document, the terms "first," "second," and "third," etc. are used merely as labels, and are not intended to impose numerical requirements on their objects.

From the foregoing, it will be observed that numerous variations and modifications can be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

Although a few embodiments have been described in detail above, other modifications are possible. For example, the logic flows depicted in the FIGS. do not require the particular order shown, or sequential order, to achieve desirable results. Other steps can be provided, or steps can be eliminated, from the described flows, and other components can be added to, or removed from, the described systems. Other embodiments can be within the scope of the following claims.

The invention claimed is:

1. A tunable antenna system comprising:
an antenna;
a processor electrically coupled to the antenna;
a detector electrically coupled to the processor; and
an antenna tuner electrically coupled between the antenna and the processor;
a directional coupler electrically coupled between the antenna and the detector;
wherein the processor is programmed to send one or more signals to the tuner to sweep the tuner through a plurality of tuner states, wherein the detector is coupled to determine a power of a signal received from the directional coupler in each respective tuner state, and wherein the processor is further programmed to send one or more signals to the tuner to set the tuner to a tuner state of the plurality of states using the determined powers,
wherein the signal from the antenna is a reflected signal from the antenna,
wherein the detector is electrically coupled between the antenna and the processor,
wherein the directional coupler includes a plurality of paths including a first path that provides a path for a majority of the reflected signal and a second path that provides a path for the remainder of the signal, and
wherein the detector is electrically coupled to the second path of the directional coupler.

2. The system of claim 1, wherein tuner state corresponds to a state of the tuner that corresponds to a minimum power of the determined powers.

3. The system of claim 1, wherein the antenna is a first antenna, wherein the system further comprises a second antenna, and wherein the signal from the first antenna is a transmitted signal from the first antenna received at the second antenna and wherein the detector is electrically coupled between the second antenna and the processor.

4. The system of claim 3, further comprising wireless recharge circuitry including a rectifier electrically coupled between the second antenna and the processor, battery charge circuitry electrically coupled between the second antenna and the processor, and a battery electrically coupled to the battery charge circuitry, wherein the battery charge circuitry is to charge the battery using energy of a signal received at the second antenna.

5. The system of claim 3, wherein the tuner state the tuner is set to corresponds to a state of the tuner that corresponds to a maximum power of the determined powers.

6. The system of claim 1, wherein the processor is programmed to send the one or more signals to the tuner to sweep the tuner through the plurality of tuner states periodically.

7. The system of claim 1, wherein the system further comprises an analog to digital converter to receive the determined powers and convert each of the determined powers to a digital word.

8. The system of claim 1, further comprising a switch electrically coupled to the processor, the switch including a plurality of electrical paths therethrough including a first electrical path for a signal to be transmitted by the antenna and a second path for a signal received by the antenna.

9. A method comprising:
sending, by processing circuitry, one or more signals to an antenna tuner to sweep the tuner through a plurality of tuner states;
providing, by a directional coupler electrically between the antenna and a detector, a first portion of a signal reflected from the antenna to a first path of the directional coupler and a second portion of the signal reflected from the antenna to a second path of the directional coupler, wherein the detector is electrically coupled to the second path of the directional coupler;
determining, using the detector, a plurality of power values, each power value corresponding to a signal received from the directional coupler and each power value corresponding to the tuner being in a state of the plurality of tuner states; and
sending one or more signals to the tuner to set the tuner to a tuner state of the plurality of tuner states, the tuner state determined using the determined powers.

10. The method of claim 9, wherein tuner state the tuner is set to corresponds to a state of the tuner that corresponds to a minimum power of the determined powers.

11. The method of claim 9, wherein the antenna is a first antenna, and wherein the signal is a transmitted signal from the first antenna received at a second antenna.

12. The method of claim 11, further comprising charging a battery using energy of a signal received at the second antenna.

13. The method of claim 9, wherein sending, by processing circuitry, one or more signals to an antenna tuner to sweep the tuner through a plurality of tuner states includes sending the one or more signals periodically.

14. A non-transitory computer readable medium comprising instructions stored thereon that, when executed by a machine, configure the machine to:
send one or more signals to an antenna tuner to sweep the tuner through a plurality of tuner states;
provide, by a directional coupler electrically between an antenna and a detector of the machine, a first portion of a signal reflected from the antenna to a first path of the directional coupler and a second portion of the signal reflected from the antenna to a second path of the directional coupler, wherein the detector is electrically coupled to the second path of the directional coupler;
determine a plurality of power values, each power value corresponding to a signal received from an antenna and each power value corresponding to the tuner being in a state of the plurality of tuner states; and
send one or more signals to the tuner to set the tuner to a tuner state of the plurality of tuner states, the tuner state determined using the determined powers.

15. The computer readable medium of claim 14, wherein tuner state the tuner is set to corresponds to a state of the tuner that corresponds to a minimum power of the determined powers.

16. The computer readable medium of claim 14, wherein the antenna is a first antenna, and wherein the signal is a transmitted signal from the first antenna received at a second antenna.

17. The computer readable medium of claim 16, further comprising instructions, which when executed by the machine, configure the machine to charge a battery using energy of a signal received at the second antenna.

18. The computer readable medium of claim 14, wherein the instructions for sending one or more signals to an antenna tuner to sweep the tuner through a plurality of tuner states include instructions, which when executed by the machine, configure the machine to send the one or more signals periodically.

\* \* \* \* \*